United States Patent [19]

Babinec et al.

[11] Patent Number: 4,906,494

[45] Date of Patent: Mar. 6, 1990

[54] ANTISTATIC SHEET MATERIAL, PACKAGE AND METHOD OF MAKING

[75] Inventors: Michael A. Babinec; Charles L. Mott; David C. Burdeaux, all of Midland, Mich.

[73] Assignee: The Dow Chemical Company, Midland, Mich.

[21] Appl. No.: 278,126

[22] Filed: Nov. 30, 1988

Related U.S. Application Data

[63] Continuation-in-part of Ser. No. 868,824, May 29, 1986, which is a continuation-in-part of Ser. No. 785,808, Oct. 9, 1985, Pat. No. 4,756,414.

[51] Int. Cl.⁴ .................... B65D 73/02; B32B 15/08
[52] U.S. Cl. .................... 428/35.2; 206/328;
206/332; 206/524.6; 383/63; 383/109;
428/35.3; 428/35.4; 428/411.1; 428/458;
428/461; 428/480; 428/483; 428/500; 428/516;
428/520; 428/522; 428/922
[58] Field of Search .................... 428/35.2, 35.3, 35.7,
428/35.9, 411.1, 458, 461, 480, 483, 500, 516,
520, 522, 922; 206/328, 332, 524.6; 383/63, 109

[56] References Cited

U.S. PATENT DOCUMENTS

| | | | |
|---|---|---|---|
| 3,576,649 | 4/1971 | Brazier | 426/127 |
| 4,154,344 | 3/1979 | Yenni, Jr. et al. | 428/922 |
| 4,156,751 | 5/1979 | Yenni, Jr. et al. | 428/922 |
| 4,208,696 | 6/1980 | Lindsay et al. | 428/367 |
| 4,231,901 | 11/1980 | Berbeco | 428/311 |
| 4,407,872 | 10/1983 | Horri | 428/349 |
| 4,424,900 | 1/1984 | Petcavich | 206/328 |
| 4,438,176 | 3/1984 | Steiner et al. | 428/349 |
| 4,471,872 | 9/1984 | Dedow | 428/922 |
| 4,480,747 | 11/1984 | Kazor et al. | 206/328 |
| 4,496,406 | 1/1985 | Dedow | 428/922 |
| 4,557,379 | 12/1985 | Lane et al. | 206/328 |
| 4,610,353 | 9/1986 | Young | 206/328 |
| 4,623,594 | 11/1986 | Keough | 428/500 |
| 4,648,508 | 3/1987 | Neal | 206/328 |
| 4,738,882 | 4/1988 | Rayford | 428/349 |

FOREIGN PATENT DOCUMENTS 2156362A 10/1985 United Kingdom .

OTHER PUBLICATIONS

RCAS 3600 Antistatic RF/EMI Shielding Bags RCAS 4200 Static Shielding Bags.
Richmond, Static Control Systems Group, stock products catalog.
Metallized Products brochure, "Static Metallized Products Radiation Cured Static Control Products".
3–85, Converting Magazine, "EB–Curable Coating is Clear Cure for Static Evaluation Engineering, Electron Beam Radiation Cured Coatings for Static Control".
Keogh, "Electron Beam Radiation Cured Coatings for Static Control, Evaluation Engineering", Sep. 1985, pp. 50–52.

Primary Examiner—James J. Seidleck

[57] ABSTRACT

An antistatic sheet material and package formed therefrom is provided. The laminated sheet material includes a first inner layer which is preferably a coextruded film having a polyolefin ply and second copolymer ply of ethylene-acrylic acid copolymer, ethylene vinyl acetate copolymer, or blends thereof, a second intermediate layer such as a polyester film having an electrically conductive material thereon, and an outer layer of an antistatic material. The laminate may be formed by hot roll lamination or an adhesive may be used between the first and second layers.

22 Claims, 3 Drawing Sheets

ANTISTATIC SHEET MATERIAL, PACKAGE AND METHOD OF MAKING

CROSS REFERENCE TO RELATED APPLICATIONS

This application is a continuation-in-part of U.S. application Ser. No. 868,824, filed May 29, 1986, and entitled "ANTISTATIC SHEET MATERIAL. PACKAGE AND METHOD OF MAKING," which in turn is a continuation-in-part of U.S. application Ser. No. 785,808, filed Oct. 9, 1985, now U.S. Pat. No. 4,756,414, issued July 12, 1988, the disclosures of which are hereby specifically incorporated by reference.

BACKGROUND OF THE INVENTION

This invention relates to an antistatic sheet material used for forming packages or the like for containing electrostatically sensitive components and protecting them from potentially damaging electrostatic charges, to packages formed therefrom, and to a method of making the same.

As electronic components and units have become increasingly more complex, while achieving ever smaller dimensions, the problem of damage to such components due to electrostatic discharge has become of major concern. The buildup of electrostatic charges on the packages for such components can result in the discharge of a spark which can arc over or otherwise damage or destroy the components.

Similarly, the medical and pharmaceutical industries have requirements for ultraclean instruments and drug substances. Packaging of such instruments and drugs is a problem because buildup of electrostatic charges on the packaging materials attracts dust and other contaminants from the air and surroundings. Such contaminants may become mixed with the chemicals of drugs causing purity problems. Likewise, when the package is opened or the product poured out a static charge is generated on the product which may attract contaminates.

Accordingly, a number of packages and packaging materials have been developed which have antistatic properties. These antistatic packages have found wide use in a number of industries including the aerospace, chemical and pharmaceutical, and computer and electronics industries. Such packages are designed to prevent the buildup of electrostatic charges on the product contained therein, and may also be designed to provide protection against external electric fields.

For example, many packages have been fabricated of plastic films or sheets compounded with or coated with antistatic additives such a quaternary amines, amine salts or soaps, polyethylene glycols or ethers, and the like. These agents act as humectants, absorbing moisture from the air, to reduce friction within the package and static charge buildup on the package. However, such antistatic agents may not be permanent (i.e.. may migrate to the surface and be lost from the plastic) and are humidity dependent.

Other packages have included one or more layers of conductive material to form a protective envelope or Faraday cage-type structure about the product. A Faraday cage may be defined as an electrostatic shield composed of a continuous mesh or series of interconnected electrical conductors which surrounds a defined volume of space. Examples of packages utilizing conducting layers include Yenni Jr., et al, U.S. Pat. Nos. 4,154,344 and 4,156,751; Petcavich, U.S. Pat. No. 4,424,900; Horii, U.S. Pat. No. 4,407,872 and Dedow, U.S. Pat. Nos. 4,471,872 and 4,496,406. See also Brazier, U.S. Pat. No. 4,576,649 which discloses an antistatic laminated plastic package for electrically non-conductive pulverulent material.

Other forms of antistatic laminated plastic packages are known. For example. Richmond Technology, Inc. has in recent years marketed RCAS 3600 Antistatic. RF/EMI Shielding Bags and RCAS 4200 Static Shielding Bags. The RCAS 3600 bags are advertised as having an aluminum foil layer buried between an antistatic treated Tyvek (a registered trademark of DuPont Co.) and Richmond's RCAS 1200 antistatic polyethylene. The RCAS 4200 bags are advertised as having an aluminum metallization layer sandwiched between a non-sparking outer layer of strong polyester and an inner layer of RCAS 1200 antistatic polyethylene.

Even more recently Neal U.S. Pat. No. 4,648,508, issued Mar. 10, 1987. discloses a method for coextruding a single film construction with two distinctly different surface characteristics for the purpose of an electronic package composite or envelope. The envelope has an inner anti-static polyethylene layer having a surface resistivity of less than $10^{12}$ ohms/sq. and an outer conductive carbon-containing polyethylene layer having a surface resistivity of less than $10^3$ ohms/sq. Rayford et al, U.S. Pat. No. 4,738,882, issued Apr. 19. 1988, discloses an antistatic laminated sheet material comprising an insulating layer, a metal layer of surface resistivity not exceeding about $10^4$ ohms/sq. and a conductive ink layer.

Finally, reference is made to grandparent application Ser. No. 785,808, which issued as U.S. Pat. No. 4,756,414 on July 12, 1988. The antistatic sheet material and package there disclosed utilizes an electron beam curable antistatic material which is particularly advantageous in rendering antistatic the outer surfaces of the laminated material. However, the preferred process disclosed requires three separate electron beam treatment steps which are time consuming and costly. In addition, some problems in ply delamination, low seam strength, and excessive odor have on occasion been encountered.

Accordingly, the need exists for a more efficient method of producing a laminated antistatic sheet material and a laminated antistatic sheet material and package having improved properties.

SUMMARY OF THE INVENTION

The present invention meets that need by providing an improved method and resulting laminated antistatic sheet material which may be formed into a package for protecting electrostatically sensitive electronic components as well as sensitive chemicals, ultraclean instruments or other materials for which the buildup of electrostatic charges may cause contamination or damage problems. For the purpose of this specification, reference to electrostatically sensitive components will include not only electronic parts and devices, but also sensitive chemicals and pharmaceuticals as well as other materials or instruments which have the potential of being damaged or contaminated by an electrostatic buildup or discharge.

According to one aspect of the present invention, a laminated antistatic sheet material is provided which includes an inner layer of a flexible heat sealable plastic. The inner layer may be, for example, a single ply polyolefin film or a coextruded composite film having a first ply of a polyolefin such as polyethylene and a second ply of ethylene-acrylic acid copolymer. ethylene-vinyl acetate copolymer or a blend of the two. A second intermediate layer may be, for example, a polyester such as poly ethylene terephthalate. The second layer has an electrically conductive material deposited thereon. An outer layer of an antistatic material is coated over the second layer or, alternatively, antistatic material may be incorporated into a polymer which is in turn coated over or laminated to the second layer. Antistatic properties may then be imparted to the inner and outer layers of the laminate by passing the laminate through an electron beam curing process.

Alternatively, an adhesive may be used between the second intermediate layer and the first inner layer. This is sometimes desirable, particularly when the first inner layer is a single ply polyolefin film rather than a coextruded composite film.

The laminated antistatic sheet material can be readily formed into a package by folding the sheet onto itself and heat sealing the opposing edges. Additionally, a closure device may be attached to or incorporated in the package. A preferred closure means is a releasable interlocking plastic zipper, the opposing rib and groove elements of which may be laminated to opposing inner faces of the sheet material adjacent the open end of the package.

A preferred method for fabricating the package includes the steps of providing a first layer of a flexible heat sealable plastic material as described above having primary and secondary surfaces and a second layer of flexible plastic material which has primary and secondary major surfaces. An electrically conductive material such as a metal is preferably deposited on the primary major surface of the second layer. This deposition may be carried out using well known vacuum deposition or sputtering techniqes. Alternatively, a number of conductive materials in sheet or web form are readily commercially available and may be used.

The first and second layers of the flexible sheet may be joined together by arranging the primary surfaces in a facing relationship and hot roll laminating. When a coextruded film having a copolymer ply and a polyolefin ply is used as the inner first layer, the copolymer ply faces the metallized surface of the second intermediate layer. Upon hot roll lamination the ethylene-acrylic acid copolymer or ethylene-vinyl acetate copolymer or copolymer blend of the copolymer ply forms a strong bond with the metallized second intermediate layer. When single ply polyolefin film is used as the inner first layer, then, it is desirable to use an adhesive, such as an ethylene-acrylic acid or ethylene-vinyl acetate adhesive between the inner first layer and the metallized second layer.

In either event, the metallized surface of the second intermediate layer faces inwardly and the polyester surface at this stage faces outwardly. Following lamination to form a sub-assembly, the polyester surface of the second intermediate layer is coated with an antistatic material which comprises an acrylate monomer-oligomer mixture containing an alkylether triethyl ammonium sulfate. The antistatic material is cured by exposure to an electron beam.

The electron beam curing in the present invention may be done in a single pass following coating of the antistatic material on the lamianted sub-assembly. Surprisingly, curing by exposure to an electron beam causes both exterior facing surfaces of the laminated sheet material to possess the effect of antistatic properties. This phenomenon occurs evidently because the antistatic properties of the antistatic coating material "bloom through" the laminate and appear on the opposite side, i.e. on the exterior facing surface which is the second major surface of the inner first layer. Alternatively, an antistatic material may be compounded directly into or coated directly on the second major surface of the inner first layer.

As mentioned, the second major surface of the inner first layer is preferably a polyolefin ply such as polyethylene which is heat sealable. By folding the laminated sheet material onto itself, the polyolefin surfaces are facing and heat sealing the edges will form a package.

The flexible sheet material and process for making it provide a flexible packaging material and package which has permanent antistatic properties on both the interior and exterior facing surfaces of a package. The metal layer or metallized layer is embedded in the multilayer structure and cannot flake off or peel when the package is flexed. It provides a Faraday cage to protect the contents of the package from external electric fields. The optional zipper closure means, which may also contain an antistatic agent and/or semiconductive filler, secures the contents of the package from accidental spillage and brings the opposing faces of the open end of the package into close physical contact which enhances the Faraday cage protection. The result is a package which has permanent antistatic properties, is non-volatile, non-sluffing, non-humidity dependent, and otherwise offers a number of advantages over pre-existing antistatic packages.

Accordingly, it is an object of the present invention to provide an antistatic sheet material, package, and method for making the same which has permanent antistatic properties and protects the contents of the package from both electrostatic charge buildup within the package as well as from external electric fields. This and other objects and advantages of the invention will become apparent from the following detailed description, the accompanying drawings and the appended claims.

DETAILED DESCRIPTION OF THE PREFERRED EMBODIMENTS

Figure 1:
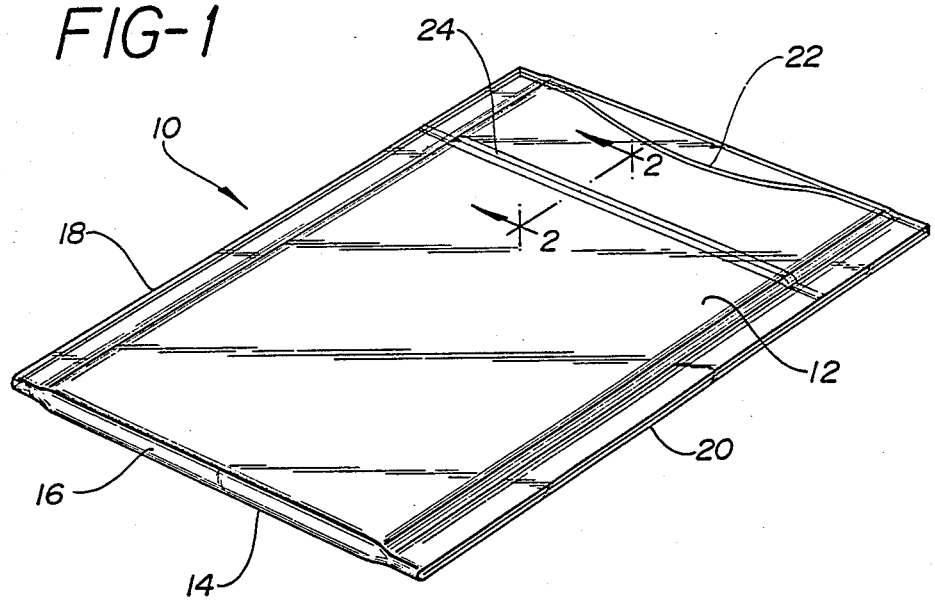
FIG. 1 is a perspective view of a package formed in connection with the teachings of the present invention.

Referring now to FIG. 1, there is illustrated a package 10 which is the preferred form of package formed in accordance with the present invention. Other package, bag, pouches, and forms, including thermoformed containers and laminated containers, may be prepared from the antistatic sheet material of the present invention. Package 10 is shown as generally rectangular in shape, but may be formed into any convenient shape or size depending on the component or material to be contained therein. Package 10 includes two opposing walls 12 and 14 which comprise the laminated antistatic sheet material of the present invention described in greater detail below. In the preferred embodiment, package lo is formed by applying releasable closure 24 to a web of the flexible sheet material, and folding the web of the flexible sheet material upon itself at fold line 16 to bring complementary rib and groove elements 26 and 28 into alignment. Opposing edges 18 and 20 are then heat sealed together and packages 10 severed from the web in a conventional manner.

Figure 2:
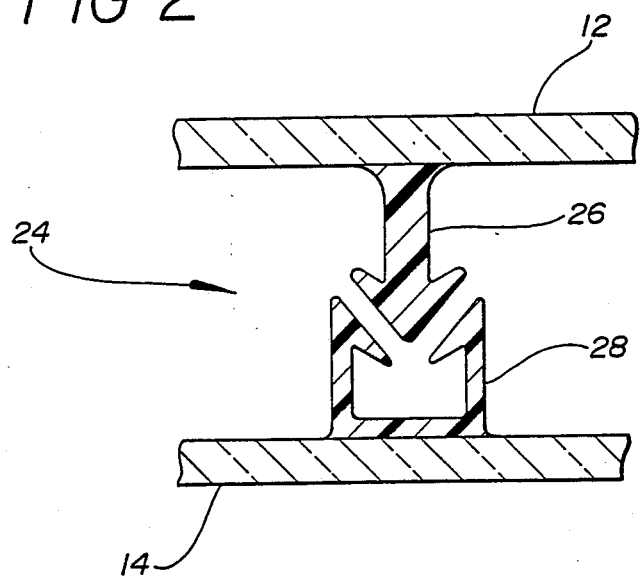
FIG. 2 is a cross-sectional view taken along line 2—2 in FIG. 1 illustrating in detail the optional zipper closure for the package.

As schematically illustrated in FIG. 2, closure 24, adjacent opening 22, comprises an interlocking zipper having complementary rib and groove elements 26 and 28, respectively. While single rib and groove elements have been illustrated for simplicity, it will be apparent to those skilled in the art that other structures such as so-called Wide Track zippers with a plurality of complementary rib and groove elements may be used. Optional closure 24 is preferably extruded or laminated onto the sheet material prior to the formation of package 10. Preferably, an antistatic material and/or semi-conductive filler is incorporated into closure 24.

Closure 24 may be used to enhance the Faraday-cage effect of the package by providing an electrical path through the zipper to opposite walls of the package. Preferably, closure 24 has a surface resistivity in the range of from about $10^{12}$ to about $10^2$ ohms/sq. Closure 24 is located approximately 0.24 to 4 inches, and preferably 0.5 to 1.5 inches, from open end 22 of package 10. Closure 24 may be omitted, or alternate closure means used, if so desired.

Figure 5:
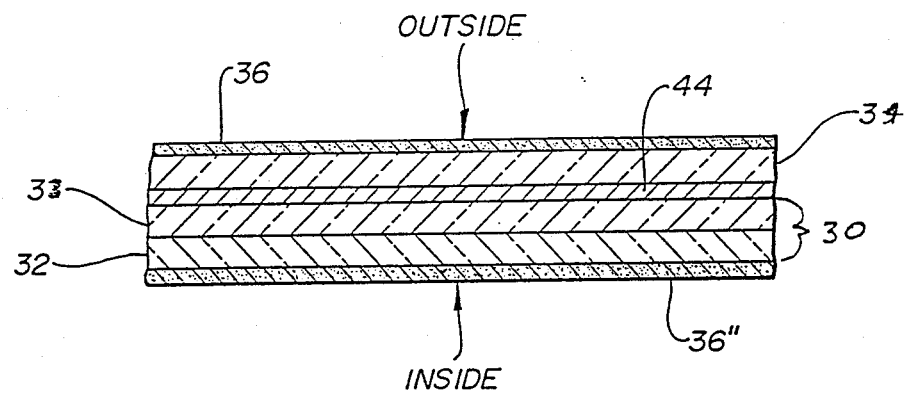
FIG. 5 is an enlarged cross-sectional view through another embodiment of the sheet material used to form the package of FIG. 1.

The preferred embodiment of the antistatic sheet material of the present invention which is used to form walls 12 and 14 of package 10 is illustrated in enlarged cross section in FIG. 5. The legends "Inside" and "Outside" have been added to the drawing to aid in the understanding of the invention. The side of the material labeled "Inside" is the inwardly facing surface of the material designed to be in contact with the contents of package 10 which is formed as described above. The "Inside" may also have closure 24 applied to it as illustrated in FIG. 2. The side of the material labeled "Outside" is the exterior or outwardly facing surface of the multilayer material.

The most preferred form of the antistatic sheet material is shown in FIG. 5. In the embodiment illustrated in FIG. 5, the inner first layer 30 may be formed by an extrusion-coating process so that it has two sub-layers or plies 32 and 33. This offers a number of advantages over processes which involve lamination steps. First ply 32 is formed of a flexible heat sealable plastic. Second ply 33 is coextruded with first ply 32.

Ply 32 is preferably a polyolefin such as polethylene (either high or low density, branched or linear), polypropylene homopolymers or copolymers, or polyolefin blends. Ply 33 may be a copolymer of ethylene and vinyl acetate, a copolymer of ethylene and acrylic acid and blends or mixtures of such copolymers.

Most preferably, first ply 32 is a blend of about 0–25% high density polyethylene and 25%–100% linear low density polyethylene, by weight, and second ply 33 is a copolymer of ethylene and from 2–15%. and more preferably. 3–8%. acrylic acid. A material such as preferred first layer 30 is a coextruded material commercially available from The Dow Chemical Company under the designation Dow Adhesive Film. Ply 33 serves as the primary major surface of inner first layer 30. Ply 33 preferably makes up between 2–80% and most preferably about 10–20% of the total thickness of inner first layer 30. The total thickness of inner first layer 30 may be in the range from to 20 mils, and preferably is approximately 2–4 mils for a package of the type shown in FIG. 1. First layer 30 would be at the upper end of the range for a thermo-formed container.

Second, intermediate layer 34 is preferably a polyester such as polyethylene terephthalate. An electrically conductive layer 44 is deposited on the primary major surface of second layer 44. Second layer is preferrably of a thickness between 25 gage and 1 mil, and most preferably is either 48 or 92 gage material. Second layer 34 is preferably joined to first layer 30 by placing the respective primary major surfaces in a facing relationship. i.e. electrically conductive layer 44 adjoins ply 33. A sub-assembly of first layer 30 and second layer 34 may, then, be formed by hot roll lamination.

An antistatic material 36 is coated on the secondary major surface of second layer 34. By "antistatic" material or agent, it is meant that the material or agent has properties which prevent the buildup of or cause the dissipation of static charges. Antistatic material 36 provides a surface conductivity in the range from about $10^8$ to about $10^{12}$ ohms/sq., and preferably about $10^{10}$ to about $10^{11}$ ohms/sq. First layer 30 also has antistatic properties (illustrated by numeral 36") on its "Inside" surface. Such antistatic properties may be created by electron beam curing antistatic material 36 to cause antistatic properties 36" to appear on the Inside surface of first layer 30.

Alternatively, antistatic properties 36" can be achieved by coating an antistatic material onto first layer 30, incorporating an antistatic material into the polymer which makes up first layer 30, or incorporatinq an antistatic material into a polymer which in turn is coated over or laminated to first layer 30.

The preferred antistatic material for use in the present invention is an acrylate monomer-oligomer mixture containing an alkylether triethyl ammonium sulfate available from Metallized products. Inc.. Winchester, Mass., under the name Staticure. The material is curable by exposure to an electron beam and cures to a permanent, nonbleeding coating which is not dependent on humidity for its antistatic effect. Further details concerning this antistatic material may be found in British patent Application No. 2,156,362, published Oct. 9, 1985, the disclosure of which is hereby incorporated by reference.

Alternatively, other known antistatic agents such as quaternary ammonium compounds or carbon may be utilized. These antistatic agents may be compounded with the polymers making up one or more layers of the sheet material, may be coated onto respective "Inside" and/or Outside surfaces of the sheet material, or may be compounded with a polymer which is then itself coated onto the respective "Inside" and/or "Outside" surfaces of the sheet material.

Electrically conductive layer 44 is preferably formed by depositing a thin layer of metal on layer 34. This deposition may be accomplished through the use of conventional vapor deposition or sputtering techniques. Preferred metals include aluminum, stainless steel. nickel, copper, and mixtures thereof. Layer 34 may be pretreated to render it more receptive to metallization. Optionally, electrically conductive layer 44 may be a coated or laminated metal grid or mesh, a metal filled plastic film, or other conductive material.

Layer 44, if vacuum deposited or sputtered, is preferably about 50 to about 200 Angstroms thick, and most preferably about 100 Angstroms thick. Its surface resistivity is preferably about 100 ohms/sq. The coating may be discontinuous and/or have pinholes therein with no substantial adverse effect on the Faraday-cage structure which results when the package is formed.

It is preferred that the combination of layers in the laminate be partially transparent or transparent to permit visual inspection of the contents of the package without the need for opening the package. Opening of the package outside of a controlled environment which allows for discharge of any static charge buildup may be detrimental. Accordingly, the ability to make a visual inspection of a packaged component, including any part or control numbers included in the package, is desirable. It is also possible to have one wall of the package partially transparent or transparent (through which the component may be inspected) and the other wall opaque. For example a cushioning layer, such as a foamed plastic film, may be laminated to, or included in wall 12 or 14 while the other wall remains as described. In the preferred embodiment where both walls are transparent, the walls of package 10 are made up of the two principal layers.

Figure 4:
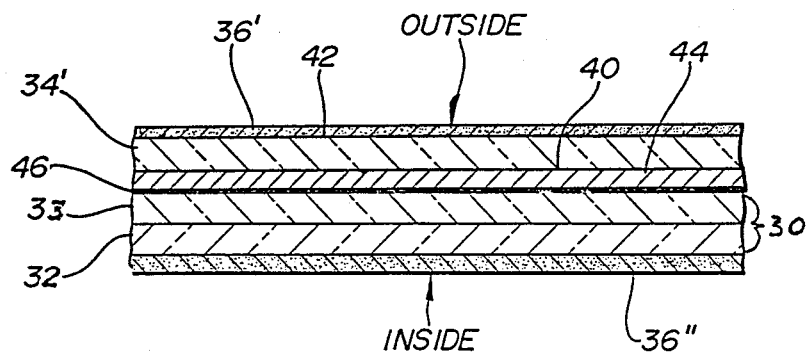
FIG. 4 is an enlarged cross-sectional view through another embodiment of the sheet material used to form the package of FIG. 1.

In the alternative embodiment illustrated in FIG. 4, where like elements are identified by like reference numerals, the sheet material comprises a first layer 30, a second layer 34', and a conductive layer 44. Second layer 34' is formed of a flexible plastic having primary and secondary major surfaces 40 and 42, respectively. Second layer 34' has deposited on its primary major surface 40, a layer of an electrically conductive material 44. The secondary major surface 42 has antistatic properties illustrated by numeral 36'.

In this instance second layer 34' is preferably a polyester, but may also be a thermoplastic polyurethane, nylon, or a polyolefin such as polyethylene or polypropylene polymers or copolymers, including copolymers of ethylene and acrylic acid or vinyl acetate.

The two layers 30 and 34' may be bonded together along their respective primary major surfaces through the use of an adhesive 46. Adhesive 46 may be a solvent or water based adhesive. Adhesive 46 may also be a thermoplastic adhesive and/or electron beam curable adhesive. Preferred is an ethylene-vinyl acetate copolymer or ethylene-acrylic acid copolymer adhesive.

Figure 3:
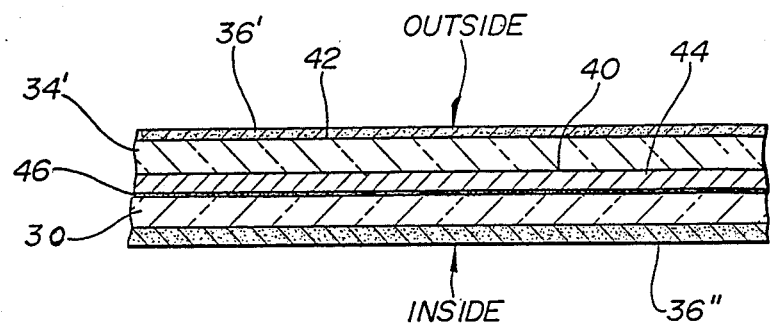
FIG. 3 is an enlarged cross-sectional view through one embodiment of the sheet material used to form the package of FIG. 1.

In the alternative embodiment shown in FIG. 3, first layer 30 is a single ply film, preferably a polyolefin such as polyethylene. As in FIG. 4, adhesive 46 is used to join first layer 30 to the metallized primary major surface of second layer 34'.

A preferred method of making the laminated antistatic sheet material of the embodiment illustrated in FIG. 5 includes the following steps. Second layer 34, which is preferably a polyester such as a 48 or 92 ga. polyethylene terephthalate is metallized on its primary major surface with an electrically conductive layer 44, which may be deposited on layer 34 by sputtering or vacuum deposition to approximately a 50% light transmission. Alternatively, a metallized plastic which is commercially available may be utilized.

First layer 30 which is preferably a 824 Dow Adheisve Film available from the assignee of the present invention having plies 32 and 33 as described is joined to second layer 34 with the primary major surfaces facing.

Hot roll lamination between rolls having an interference on the order of 0.030 inch (for a preferred thickness sub-assembly of 2-5 mils) at 200° to 400° F. for 0.2 to 2 milliseconds is used to securely bond the two layers together to form a sub-assembly. Antistatic material 36, preferably Staticure coating from Metallized products. Inc., is then applied onto the secondary major surface of layer 34 at a coat weight of between 2 lbs. and 8 lbs. per ream (3000 sq. feet) using standard coating equipment. The coating is then cured using an electron beam dosage at 1-7 megarads.

During this curing step antistatic properties are produced on both the secondary major surface of layer 34 and the secondary major surface of layer 30. This phenomenon is discussed in "EB-curable Coating is Clear Cure for Static", *Converting Magazine*, March 1985. and "Electron Beam Radiation Cured Coatings for Static Control." *Evaluation Engineering.* September 1985. That is, the "Inside" surface of layer 30, following curing of antistatic material 36, now shows antistatic properties (illustrated by numeral 36") even though no antistatic material was originally coated directly thereon. Of course, it is possible in an additional step to also coat antistatic material on the "Inside" surface of layer 30. The preferred process is illustrated by the Example I below.

Example I

A coextruded sheet material, 824 Dow Adhesive film (DAF). was laminated to metallized polyethylene terephthalate (PET) sheet material by hot roll laminating with the objective that: the electrical continuity of the metallized surface be maintained, the cure be minimized, the adhesion strength between the two sheet materials be greater than 0.3 lbs./inch, and the material should be as wrinkle free as possible. Eight hundred (800) yards of prime material were produced in less than thirty minutes by hot roll laminating a 92 ga. metallized PET to a 3 mil thick 824 DAF. An approximately four mil thick laminated sheet material (sub-assembly) was produced. Electrical continuity of the metal surface was maintained in the laminated sheet material and excellent adhesion of the DAF to the metallized PET was achieved. In fact. delamination strength could not be determined because the sample could not be delaminated without destruction.

Seven hundred and fifty (750) feet of the laminated sheet material were coated with Staticure antistatic material (15% active antistatic ingredient) from Metallized products. Inc. on 18" wide pilot scale equipment consisting of a film unwind stand, a corona treatment roll stack, a gravure coating system, an Energy Sciences electron beam curing system, and a film winder. Two coating thicknesses, namely approximately 2.5 lbs./ream and 3 lbs./ream, were achieved using a 110 Q gravure roll and a 150 Q gravure roll. respectively. The material was run at 100 ft./min. which resulted in a 2 megarad radiation dose. The curing atmosphere was held constant at $N_2$ with less than 200 ppm $O_2$. Coating adhesion was excellent. Electron beam processing did not 5 effect the laminated sheet material's superior resistance to delamination. The resultant antistatic laminated sheet material had a surface resistivity as set forth in Table I below:

TABLE I

| | | Sheet Material of U.S. Pat. No. 4,756,414 | Run Using 110Q Roll | Run Using 150Q Roll |
|---|---|---|---|---|
| Conditioned* | Coated | $1.9 \times 10^{11}$ | $1.3 \times 10^{11}$ | $7.6 \times 10^{10}$ |
| | Uncoated | $1.0 \times 10^{11}$ | $5.3 \times 10^{11}$ | $1.6 \times 10^{12}$ |
| Aged** & | Coated | $4.0 \times 10^{11}$ | $2.0 \times 10^{11}$ | $1.7 \times 10^{11}$ |
| Conditioned | Uncoated | $1.7 \times 10^{11}$ | $2.9 \times 10^{11}$ | $1.8 \times 10^{12}$ |

*Conditioned = 48 hours at 12% relative humidity, RTP.
**Aged = 2 days at 60° C.

When folded upon itself and heat sealed, the seam strength was 14 lbs./inch. No odor was observed.

Example II

Similar results have been observed when an adhesive is used between a polyethylene inner first layer and a metallized PET second layer. Such a structure is illustrated by FIG. 3. Thus an approximately 3 mil thick laminated sheet material was produced from ½ mil thick metallized PET adhered to a 2.3 mil polyethylene film (DOW LDF 318 available from the assignee of the present invention) using an electron beam curable adhesive approximately 0.2 mil thick. The adhesive was cured by exposure to two megarads resultant from 175 KV at a line speed of 100 ft/min. with a 110 Q gravure cylinder (approximately 4 lb./ream coat weight).

The uncoated subassembly film laminate had a high exterior surface resistivity (insulative). However, after coating the PET surface with Staticure antistatic material and electron beam curing as in the Example I. the surface resistivity of the laminate was found to be $7 \times 10^{10}$ ohms/square on the coated surface, and $7 \times 10^{11}$ ohms/square on the opposite surface.

Similar results were obtained when a 1 mil thick metallized PET sheet containing laminate was coated with Staticure using an 85 Q cylinder (approximately 5 lb./ream coat weight). When a 0.5 mil thick metallized PET sheet was used with an 85 Q cylinder, the coated side resistivity was found to be $2 \times 10^{10}$ ohms/square and the opposite side resistivity was found to be $6 \times 10^{10}$ ohms/square.

The laminated sheet material of Example 1 and Example II was formed into individual packages as previously described. The resulting packages exhibited good puncture and abrasion resistance. Such package are especially useful to protect electronic circuit boards and other electronic components having exposed wire ends.

Having described the invention in detail and by reference to preferred embodiments thereof, it will be apparent that modifications and variations are possible without departing from the scope of the invention defined in the appended claims.

What is claimed is:

1. A laminated sheet material adaptable for forming a package, bag, pouch, or the like for containing electrostatically sensitive components comprising:
    (a) a first inner layer of a coextruded film having a polyolefin ply and a copolymer ply selected from the group consisting of ethylene-acrylic acid copolymers. ethylene-vinyl acetate copolymers and blends thereof.
    (b) a second intermediate layer having an electrically conductive material deposited thereon laminated to said first inner layer and adjoining said copolymer ply, and
    (c) an outer layer of an antistatic material, said opposite said first inner layer.

2. The laminated sheet material of claim 1 in which said inner layer has antistatic properties.

3. The laminated sheet material of claim 2 in which said antistatic material is a cured acrylate monomer-oligomer mixture containing an alkylether triethyl ammonium sulfate.

4. The laminated sheet material of claim 1 wherein said second intermediate layer is a polyester film.

5. The laminated sheet material of claim 1 wherein said electrically conductive material on said second intermediate layer adjoins an ethylene-acrylic acid copolymer ply of said first inner layer.

6. The laminated sheet material of claim 5 in Which said electrically conductive material is a metal selected from the group consisting of aluminum, stainless steel, nickel, copper, and mixtures thereof.

7. A laminated sheet material adaptable for forming a package, bag, pouch, or the like for containing electrostatically sensitive components comprising:
    (a) a first inner layer of a coextruded film having a polyolefin ply and a copolymer ply selected from the group consisting of ethylene-acrylic acid copolymers, ethylene-vinyl acetate copolymers, and blends thereof,
    (b) a second intermediate layer having an electrically conductive material deposited thereon.
    (c) a layer of adhesive between said first layer and said second layer bonding said first layer to said second layer with said copolymer ply adjoining said layer of adhesive, and
    (d) an outer antistatic surface, said outer surface being located on the side of said second layer opposite said first inner layer.

8. The laminated sheet material of claim 7 in which said polyolefin ply is a polyethylene and said second layer is a polyester film.

9. The laminated sheet material of claim 8 in which said electrically conductive material is selected from the group consisting of aluminum, stainless steel, nickel, copper, and mixtures thereof.

10. The laminated sheet of claim 9 wherein said antistatic material is a cured acrylate monomer-oligomer mixture containing an alkylether triethyl ammonium sulfate.

11. A laminated sheet material adaptable for forming a package, bag, pouch, or the like for containing electrostatically sensitive components comprising:
    (a) a first inner layer of a polyolefin film having antistatic properties.
    (b) a second intermediate layer having an electrically conductive material deposited thereon,
    (c) a layer of adhesive between said first layer and said second layer with said electrically conductive material of said second layer adjoining said layer of adhesive, and
    (d) an outer antistatic surface, said outer surface being located on the side of said second layer opposite said first inner layer.

12. The laminated sheet material of claim 11 wherein said second layer is a polyester film.

13. The laminated sheet material of claim 12 in which said electrically conductive material is selected from the group consisting of aluminum, stainless steel, nickel, copper, and mixtures thereof.

14. The laminated sheet material of claim 13 wherein said antistatic material is a cured acrylate monomer-oligomer mixture containing an alkylether triethyl ammonium sulfate.

15. A package adapted to receive and protect an electrostatically sensitive component, the walls of said package formed of an antistatic sheet material comprising:
   (a) a first inner layer of a coextruded film having a polyolefin ply and a copolymer ply selected from the group consisting of ethylene-acrylic acid copolymers, ethylene-vinyl acetate copolymers, and blends thereof,
   (b) a second layer having an electrically conductive material deposited thereon laminated to said first inner layer and adjoining said copolymer ply, and
   (c) an outer layer of an antistatic material, said outer layer being located on the side of said second layer opposite said first layer.
   said package being formed by joining together said walls along opposing side edges of facing first inner layers of said antistatic sheet material.

16. The package of claim 15 in which said first layer has antistatic properties.

17. The package of claim 15 including releasable, interlocking closure means on opposing inner faces of one end of said walls.

18. The package of claim 17 in which said closure means comprise interlocking rib and groove elements fabricated of a polyolefin polymer which has been treated with an antistatic agent and/or semiconductive filler.

19. The package of claim 15 in which said antistatic material is a cured acrylate monomer oligomer mixture containing an alkylether triethyl ammonium sulfate.

20. A package adapted to receive and protect an electrostatically sensitive component, the walls of said package formed of an antistatic sheet material comprising:
   (a) a first inner layer of a polyolefin film having antistatic properties;
   (b) a second layer having an electrically conductive material deposited thereon.
   (c) a layer of adhesive between said firs layer and said second layer bonding said first layer to said second layer, with said electrically conductive material of said second layer adjoining said layer of adhesive, and
   (d) an outer antistatic surface, said outer surface being located on the side of said second layer opposite said first inner layer.
   said package being formed by joining together said walls along opposing side edges of facing first layers of said antistatic sheet material.

21. The package of claim 20 in which said polyolefin film is a polyethylene film and said second layer is a polyester film.

22. The package of claim 21 in which said electrically conductive material is a metal selected from the group consisting of aluminum, stainless steel, nickel, copper, and mixtures thereof.

* * * * *

UNITED STATES PATENT AND TRADEMARK OFFICE
CERTIFICATE OF CORRECTION

PATENT NO. : 4,906,494

DATED : March 6, 1990

INVENTOR(S) : Michael A. Babinec, Charlie L. Mott, and David C. Burdeaux

It is certified that error appears in the above-identified patent and that said Letters Patent is hereby corrected as shown below:

Column 2, line 28, "Apr. 19. 1988," should correctly appear as --Apr. 19, 1988,--.

Column 5, line 6, "lo" should correctly appear as --10--.

Column 6, line 6, insert the numeral "1" after --from--.

Column 6. line 37, "incorporatinq" should correctly appear as --incorporating--.

Column 6, line 65, "steel." should correctly appear as --steel,--.

Column 8, line 47, insert a comma after the word --be--.

Column 8, line 65, delete the number "5".

Column 9, line 34, "th e" should correctly appear as --the--.

Column 10, line 1, after the word said, insert the following --outer layer being located on the side of said second layer--.

Column 10, line 15, "Which" should correctly appear as --which--.

Column 12, line 12, "firs" should correctly appear as --first--.

Signed and Sealed this

Ninth Day of April, 1991

Attest:

HARRY F. MANBECK, JR.

Attesting Officer

Commissioner of Patents and Trademarks